(12) United States Patent
Tadatomo et al.

(10) Patent No.: US 6,225,650 B1
(45) Date of Patent: May 1, 2001

(54) GAN GROUP CRYSTAL BASE MEMBER HAVING LOW DISLOCATION DENSITY, USE THEREOF AND MANUFACTURING METHODS THEREOF

(75) Inventors: Kazuyuki Tadatomo; Hiroaki Okagawa; Youichiro Ohuchi; Keiji Miyashita, all of Itami; Kazumasa Hiramatsu, Yokkaichi; Nobuhiko Sawaki, Nagoya; Katsunori Yahashi, Yokohama; Takumi Shibata, Tajimi, all of (JP)

(73) Assignee: Mitsubishi Cable Industries, Ltd., Hyogo (JP)

( * ) Notice: Subject to any disclaimer, the term of this patent is extended or adjusted under 35 U.S.C. 154(b) by 0 days.

(21) Appl. No.: 09/046,638

(22) Filed: Mar. 24, 1998

(30) Foreign Application Priority Data

| Mar. 25, 1997 | (JP) | 9-091512 |
| Mar. 25, 1997 | (JP) | 9-091513 |
| Oct. 24, 1997 | (JP) | 9-293049 |
| Oct. 24, 1997 | (JP) | 9-293066 |

(51) Int. Cl.$^7$ .................................. H01L 31/0328
(52) U.S. Cl. .................. 257/190; 257/194; 117/101
(58) Field of Search ........................... 257/194, 190, 257/195, 97, 79, 103, 76; 438/107, 28, 47, 604, 602, 606, 190; 117/101, 89

(56) References Cited

U.S. PATENT DOCUMENTS

| 4,578,142 | * | 3/1986 | Corboy, Jr. et al. ............... 117/89 |
| 5,122,845 | * | 6/1992 | Manabe et al. .................... 257/76 |
| 5,328,549 | * | 7/1994 | Bozler et al. ...................... 438/107 |
| 5,389,571 | * | 2/1995 | Takeuchi et al. .................. 438/28 |
| 5,656,832 | * | 8/1997 | Ohba et al. ....................... 257/190 |
| 5,843,227 | * | 12/1998 | Kimura et al. .................... 117/101 |
| 5,880,485 | * | 3/1999 | Marx et al. ....................... 257/94 |
| 6,051,849 | * | 4/2000 | Davis et al. ...................... 257/103 |

OTHER PUBLICATIONS

K. Hiramatsu et al., Growth Mechanism of GaN grown on sapphire with AlN buffer alyer by MOVPE, Journal of Crystal Growth, Vo. 115(1991) pp. 628–633.*

* cited by examiner

Primary Examiner—Long Pham
Assistant Examiner—William David Coleman
(74) Attorney, Agent, or Firm—Wenderoth, Lind & Ponack, L.L.P.

(57) ABSTRACT

A GaN group crystal base member comprising a base substrate, a mask layer partially covering the surface of said base substrate to give a masked region, and a GaN group crystal layer grown thereon to cover the mask layer, which is partially in direct contact with the non-masked region of the base substrate, use thereof for a semiconductor element, manufacturing methods thereof and a method for controlling a dislocation line. The manufacturing method of the present invention is capable of making a part in the GaN group crystal layer, which is above a masked region or non-masked region, have a low dislocation density.

12 Claims, 14 Drawing Sheets

F I G. 8 (a)
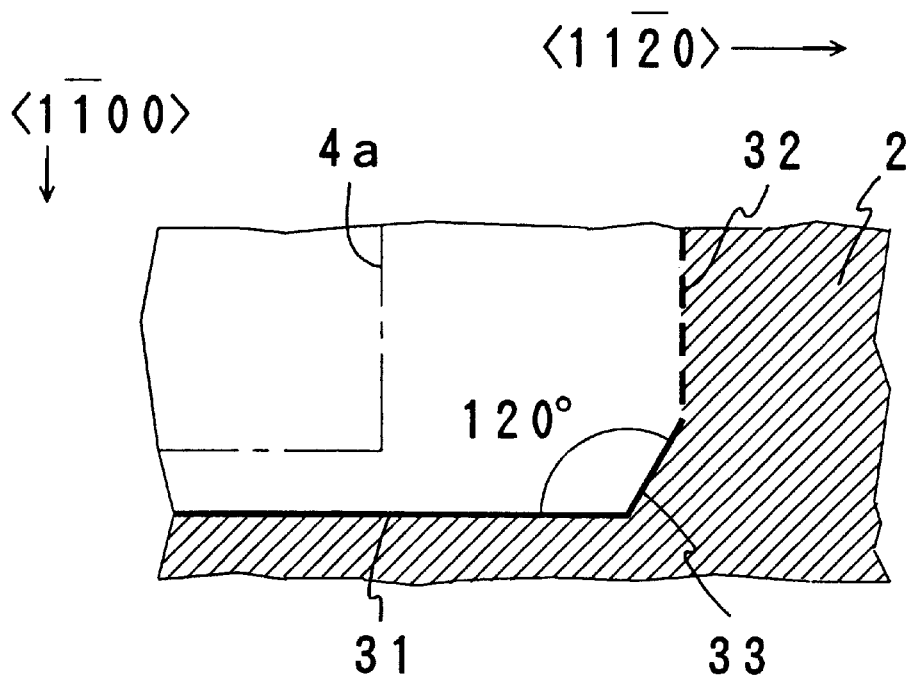
F I G. 8 (b)
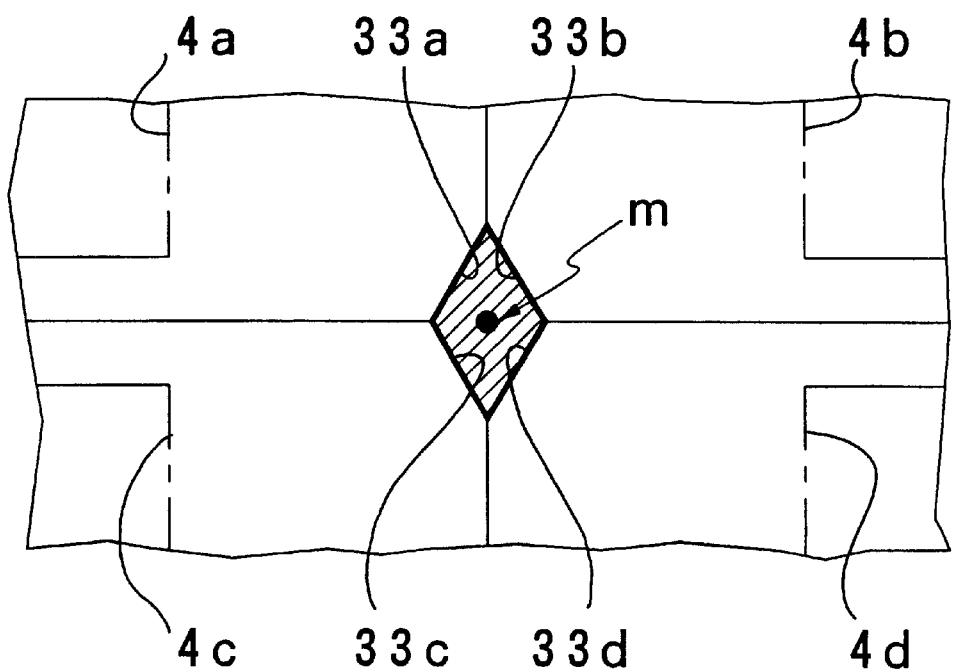

F I G. 9 (a)
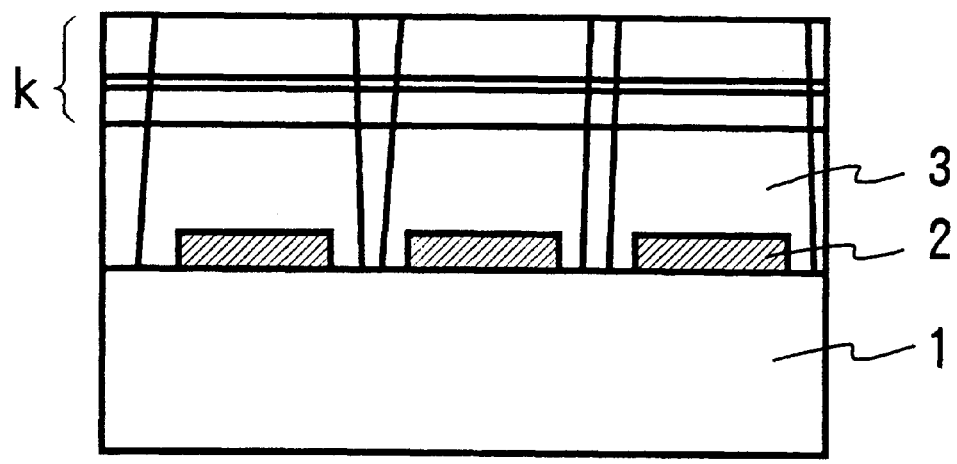
F I G. 9 (b)
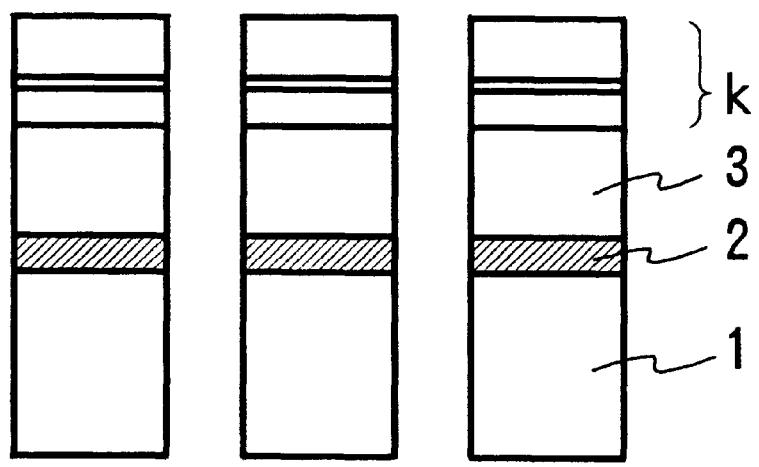

F I G. 1 3 (a)
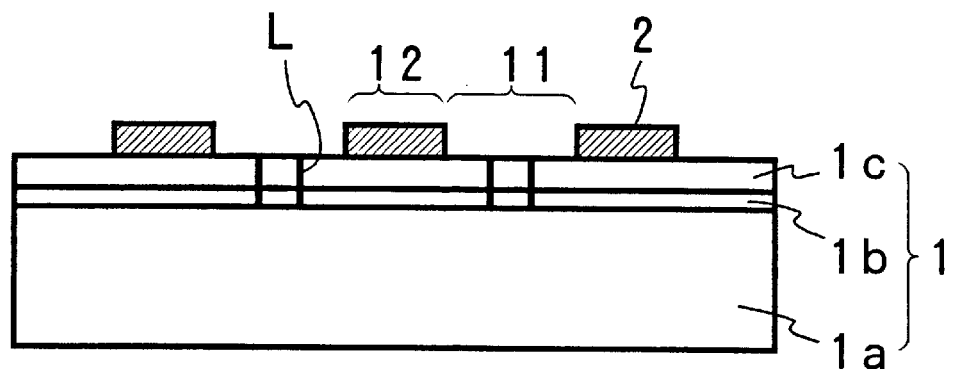
F I G. 1 3 (b)
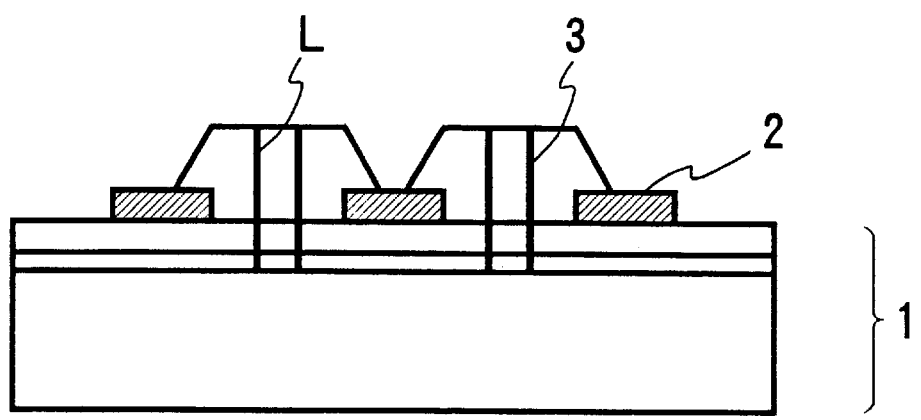
F I G. 1 3 (c)
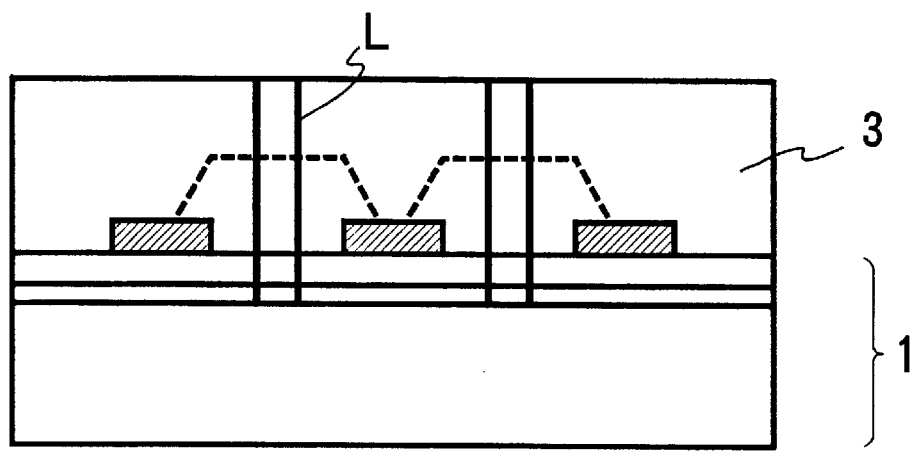

GAN GROUP CRYSTAL BASE MEMBER HAVING LOW DISLOCATION DENSITY, USE THEREOF AND MANUFACTURING METHODS THEREOF

FIELD OF THE INVENTION

The present invention relates to a GaN (gallium nitride) group crystal base member, use thereof (e.g., semiconductor light emitting element), and manufacturing methods thereof.

BACKGROUND OF THE INVENTION

A conventional method for crystal growth of a GaN semiconductor material to give a thick film generally comprises forming a buffer layer of ZnO and the like on a sapphire substrate and growing a GaN semiconductor material by an HVPE method. An improved technique thereof involves the use of a substrate such as one made from spinel, LGO, LAO, ZnO, SiC and the like or a substrate showing easy cleavage performance, instead of the sapphire substrate.

However, the crystal growth of a GaN semiconductor material to give a thick film results in tremendous amounts of stress applied on the interface between GaN and sapphire substrate due to different lattice constants and coefficients of thermal expansion, which in turn leads to a problem in that GaN is broken and a bulky substrate cannot be obtained. In addition, this method produces only a substrate having an extremely great dislocation density (e.g., $1 \times 10^9$ cm$^{-2}$–$1 \times 10^{10}$ cm$^{-2}$). By dislocation is meant here a defect that occurs when a semiconductor layer is grown on a substrate under a lattice mismatch. The dislocation thus created advances upward along with the growth of the crystal layer and passes through an active layer to form a continuous defective portion called a dislocation line (continuous dislocation). Inasmuch as this dislocation is a crystal defect, it acts as a non-radiative recombination center or as a path of a current to ultimately induce current leakage when such GaN semiconductor material is used for a light emitting element, which in turn degrades light emitting performance and shortens the service life.

It is therefore an object of the present invention to provide a GaN group crystal base member having a low dislocation density.

Another object of the present invention is to provide use of the aforementioned GaN group crystal base member.

Yet another object of the present invention is to provide a method for producing the aforementioned GaN group crystal base member and a method for producing a light emitting element which is one use thereof.

SUMMARY OF THE INVENTION

The GaN group crystal base member of the present invention comprises a base substrate, a mask layer partially covering the surface of said base substrate, and a GaN group crystal layer which is grown thereon to cover the above-mentioned mask layer and which is partially in direct contact with the non-masked region of the base substrate. Said base substrate allows growth of a GaN group crystal in the C axis orientation as the thickness direction, and the mask layer is made from a material substantially free from GaN group crystal growth.

The base substrate partially covered with a mask layer is hereinafter simply called a "substrate for growth" to mean a substrate used to grow a GaN group crystal The GaN group crystal layer grows from the non-masked region of the substrate for growth as the staring point until it covers the mask layer, whereby a GaN group crystal base member comprising the base substrate, mask layer and GaN group crystal layer is provided.

The method for manufacturing the GaN group crystal base member of the present invention comprises partially covering the surface of the base substrate with a mask layer made from a material substantially free from crystal growth, and then growing a GaN group crystal layer from the non-masked region on the base substrate surface as the starting point to a thickness sufficient to cover said mask layer.

BRIEF DESCRIPTION OF THE DRAWINGS

FIGS. 8(a), (b) show the growth of the crystal in the transverse direction from the openings in the present invention, wherein FIG. 8(a) shows the growth of a GaN group crystal in the transverse direction from one square opening (two-dot chain line) shown in FIG. 1 and FIG. 8(b) shows merger of GaN group crystals from four directions into one.

FIGS. 9(a), (b) show the production steps of a GaN group light emitting diode using the substrate for growth of the present invention.

FIGS. 13(a)–(c) show another method for controlling the dislocation line according to the present invention and another embodiment of the manufacturing method of the GaN group crystal base member of the present invention.

DETAILED DESCRIPTION OF THE INVENTION

Figure 1:
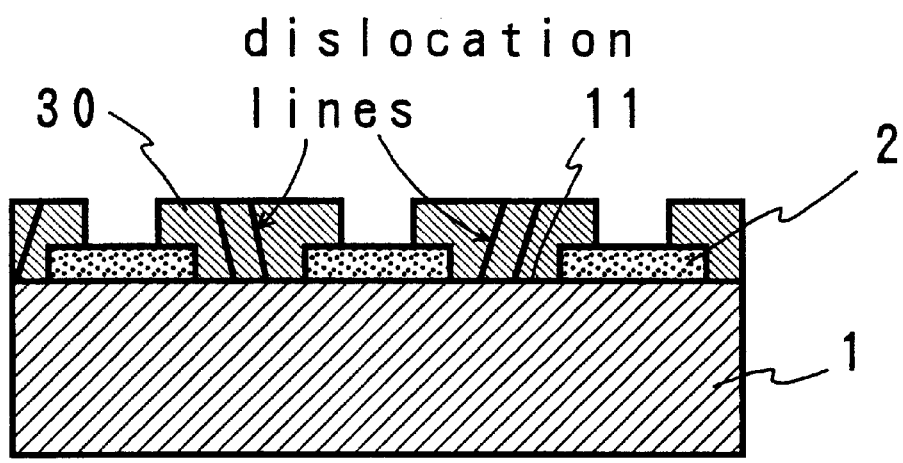
FIGS. 1(a), (b) are sectional views of the GaN group crystal base member of the present invention and its state during the ongoing growth.
Figure 1:
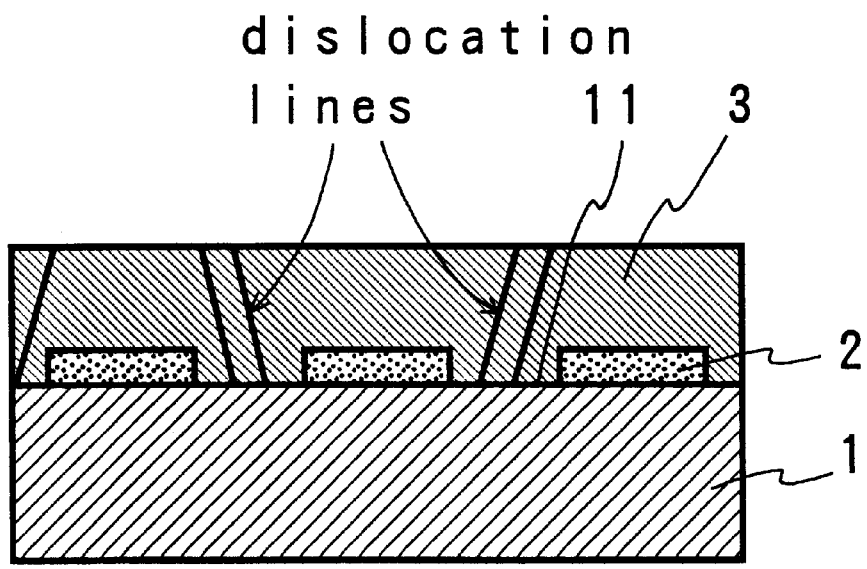

In the present specification, when the lattice plane of a crystal having a hexagonal system, such as GaN group crystal and sapphire substrate, is indicated by four Miller indices (h, k, i, l) and the index is in the negative, a minus symbol is put in front of the index. Other than the minus symbol indication, the widely accepted indication of Miller indices will be employed. In the case of GaN group crystals, for example, there are six prism planes (specific planes) parallel to the C axis. One of them is indicated as (1–100), and when the six planes are to be equivalently indicated, the symbol {1–100} will be used. The planes perpendicular to the above-mentioned {1–100} plane and parallel to the C axis are equivalently designated as {11–20}. The orientation perpendicular to the (1–100) plane is designated as [1–100] and the orientation collectively equivalent thereto is designated as <1–100>. The orientation perpendicular to the (11–20) plane is designated as [11–20] and the orientation collectively equivalent thereto is designated as <11–20>. When the Miller indices are to be shown in the drawings and the index is in the negative, the index is supplied with a bar on the index numeral and other indications follow those of Miller indices. The crystal orientation as used in the present invention is the orientation based on the GaN group crystal grown on the base substrate in the C axis orientation as the thickness direction.

The non-dislocation as referred to in the present invention means not only the ideal state completely free of dislocation which is theoretically possible, but also the state considered to have sufficiently low dislocation density to the degree the influence of the dislocation may be ignored from the industrial aspect, when compared to the dislocation density in the case where a GaN group crystal is grown on a sapphire substrate via a buffer layer.

The GaN group as referred to in the present invention means a material of the formula: $In_xGa_xAl_zN$ ($0 \leq X1$, $0 \leq Y \leq 1$, $0 \leq Z \leq 1$, $X+Y+Z=1$). In particular, the material useful as a thick film layer includes those made from GaN, AlGaN, InGaN and the like.

Figure 3:
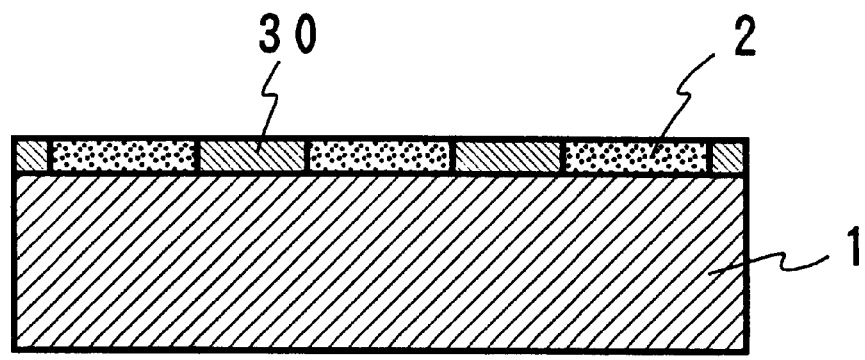
FIG. 3 is a sectional view of a conventional GaN group crystal base member.

The present inventors previously proposed forming mask layers 2 having a lattice pattern on a base substrate I to avoid cracks in the GaN layer caused by the different lattice constants as well as different coefficients of thermal expansion between GaN and sapphire substrate, and growing chip sized GaN layers 30 in the openings (non-masked region) exposing the substrate surface, as shown in FIG. 3 (Japanese Patent Unexamined Publication No. 273367/1995).

Subsequent studies done by the present inventors have revealed that, when the disposed GaN layers 30 are further grown, the crystal grows not only in the thickness direction but also in the transverse direction from each GaN layer 30 onto the mask layer 2, as shown in FIG. 1(a). It has been further clarified that different growth conditions result in crystal orientation-dependent crystal growth.

It has been further found that the dislocation present in the above-mentioned crystals may continue from the base inclusive of the substrate or may be generated in certain growth interface and grow along with the crystal growth. When GaN crystal is grown from the non-masked region as the starting point to cover the mask layer, the thickness necessary to cover the mask layer and the location of the low dislocation density part vary according to the direction of the mask layer (direction of the boundary line between the masked region and non-masked region) and atmospheric gas during GaN crystal growth.

When the above-mentioned transverse growth further proceeds, as shown in FIG. 1 (b), the mask layer 2 is completely embedded, and a bulky, thick GaN layer 3 which is flat and associated with no cracks and less defects can be obtained. It is speculated that the absence of cracks is attributable to the alleviation of the stress resulting from the fact that the mask layer 2 and GaN layer 3 are merely in contact with each other at the interface between them. The present invention is based on these findings.

In the GaN group crystal base member of the present invention as shown in the embodiment of FIG. 1, the surface of the base substrate 1 is partially covered by mask layer 2, and the GaN group crystal layer 3 grows from the non-masked region 11 of the base substrate 1 and covers the mask layer 2.

The material of the above-mentioned base substrate 1 may be, for example, sapphire crystal (C face, A face), rock crystal, SiC and the like which are widely used to form GaN group crystal layers. In particular, sapphire substrate (C face) is preferred. The substrate may have a buffer layer of ZnO, MgO, AlN and the like on its surface to reduce the difference in the lattice constant and coefficient of thermal expansion between the substrate and GaN group crystal layer. In addition, a material having a thin layer of $In_xGa_yAl_zN$ ($0 \leq X \leq 1$, $0 \leq Y \leq 1$, $0 \leq Z \leq 1$, $X+Y+Z=1$) such as GaN or GaAlN formed on said buffer layer may be appropriately used. Such base substrate can reduce the density of the dislocation newly generated from the non-masked region into a GaN group crystal layer 3 and afford a GaN group crystal layer 3 having fine crystallinity.

The mask layer 2 should be one, from which surface a GaN group crystal does not substantially grow. Examples of such material include non-crystalline materials such as nitrides and oxides of Si, Ti, Ta, Zr and the like, namely, $SiO_2$, $SiN_xSiO_{1-x}N_x$, $TiO_2$, $ZrO_2$ and the like. In particular, $SiO_2$, $SiN_x$ and $SiO_{1-x}N_x$ are suitable which are superior in heat resistance and which allow relatively easy film formation and removal by etching. These materials may be formed into a multilayer structure.

The mask layer 2 may be formed by either an additive method or subtractive method. The subtractive method may comprise covering the entire substrate with a masking material by MOVPE, sputtering, CVD and the like and leaving a desired pattern by etching, thereby exposing the substrate surface to be used as a non-masked region.

The mask layer 2 may have any pattern such as a lattice pattern, a stripe pattern and a dot pattern. Of these, a lattice pattern is preferable in that it enables efficient use of the surface area of the base substrate 1. When the mask layer is formed into a lattice pattern, the shape of one exposed part (non-masked region) may be a quadrangle, a polygon or a circle.

Figure 2:
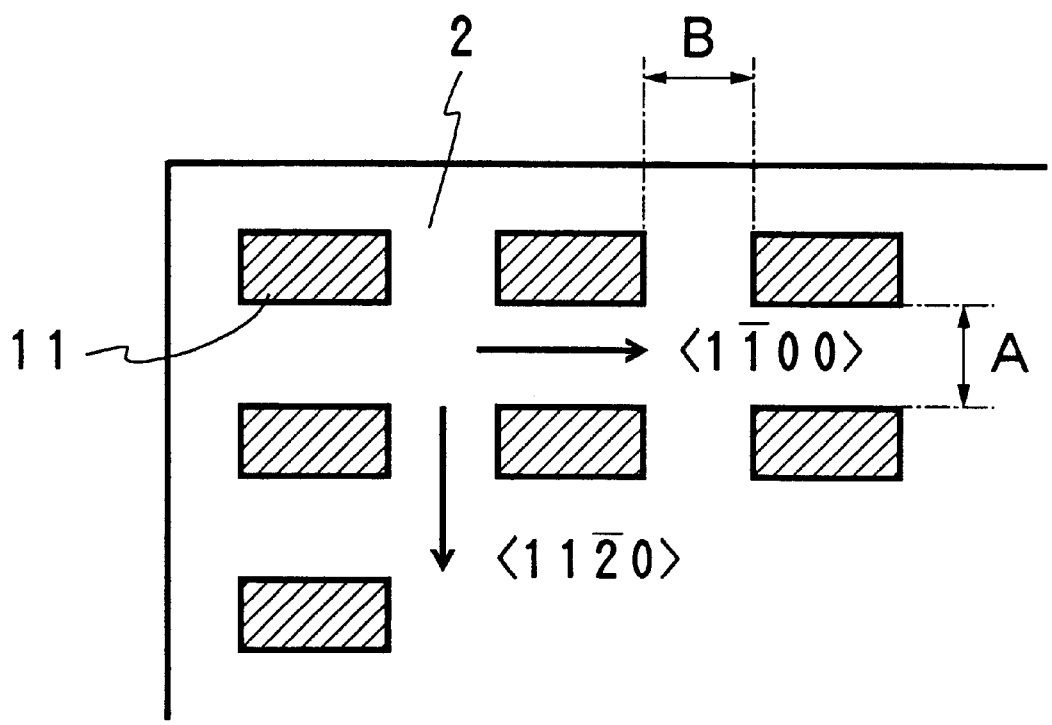
FIG. 2 shows one embodiment of the mask layer pattern used in the present invention.

The present inventors have found that the rate of GaN group crystal growth in the transverse direction on the mask layer is greater in the growth in the <11–20> orientation than in the growth in the <1–100> orientation. As shown in FIG. 2, it is desirable that this property be utilized to the maximum possible extent by setting the relation between the lattice width A in the <11–20> orientation and the lattice width B in the <1–100> orientation to $0 \leq A \leq B$. The widths A, B of the lattice are preferably about 1 $\mu$m to 2 mm. When the shape of the exposed part is quadrangle, it is an about 1 $\mu$m to 2 mm quadrangle.

A GaN group crystal layer 3 is formed on the substrate for growth. The growth of the GaN group crystal starts from the non-masked region alone of the base substrate 1. In other words, the GaN group crystal layer 3 and the base substrate 1 directly contact with each other only at the non-masked region. Further growth completely buries the cavity as the non-masked region, and the top surface of the crystal becomes higher than the top surface of the mask layer 2. Yet further growth makes the GaN group crystal extend not only in the thickness direction but also in the transverse direction along the top surface of the mask layer, which in due course joins the crystals which have grown from different non-masked regions as starting points. The crystal ultimately covers the mask layer 2 completely, along which the growth in the thickness direction continues until it forms the GaN group crystal layer 3.

The GaN group crystal layer 3 can be grown by any method such as the HVPE method, the MOCVD method, the MBE method and the like. When a thick film is to be grown in the C axis orientation at a high speed, the HVPE method is preferable, but when a thin film is to be formed, the MOCVD method is preferable.

A semiconductor light emitting element such as LED and LD (laser diode) can be produced by forming a light emitting part comprising a cladding layer and an active layer, and electrodes on the GaN group crystal base member of the present invention, particularly, a GaN group crystal layer 3 grown thick.

Figure 4:
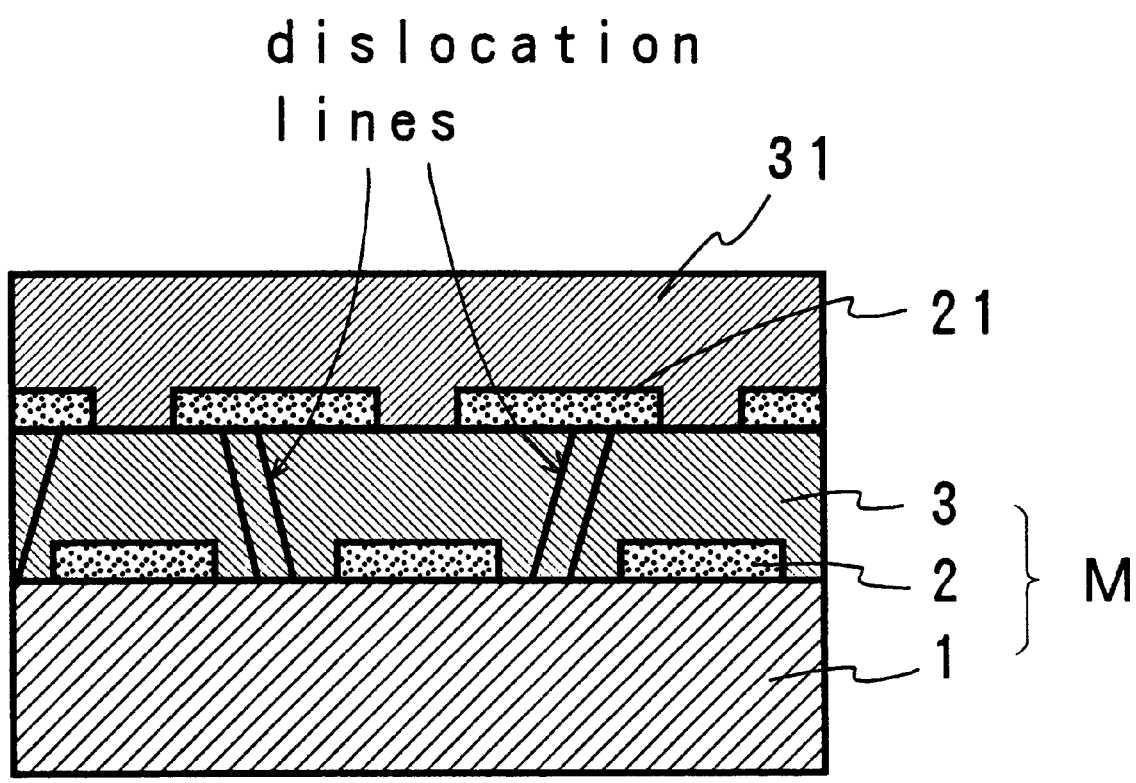
FIG. 4 is a sectional view of another embodiment of the GaN group crystal base member of the present invention.

As in the embodiment of FIG. 1, when a low dislocation density part is formed on the mask layer 2, occurrence of dislocation is not reduced in other parts. Thus, in the present invention, as shown in FIG. 4, the GaN group crystal base member (base substrate 1, first mask layer 2 and first GaN group crystal layer 3) shown in the above-mentioned FIG. 1 is used as a new base substrate M, on which a second mask layer 21 is formed in the same manner as in FIG. 1, thereby shutting off extension of the dislocation line, and then a second GaN group crystal layer 31 is grown thereon. In this manner, a GaN group crystal base member almost without dislocation can be obtained. In FIG. 4, the dislocation lines linearly rise from the non-masked region.

The GaN group crystal base member obtained by forming the above-mentioned second GaN group crystal layer 31 is used as a new base substrate M, and a mask layer and a GaN group crystal layer may be repeatedly formed an optional number of times to form a GaN crystal having an almost non-dislocation state.

Another preferable mode for forming a mask layer is explained in the following. When a dislocation line linearly advances upward from the non-masked region, the GaN crystal of the part grown on the masked region is utilized. Thus, the masked region should be made as large as possible. While a non-masked region which is unnecessarily large is useless, too large a masked region has been found to be also undesirable in that the time necessary for the completion of the crystal growth becomes long.

Figure 5:
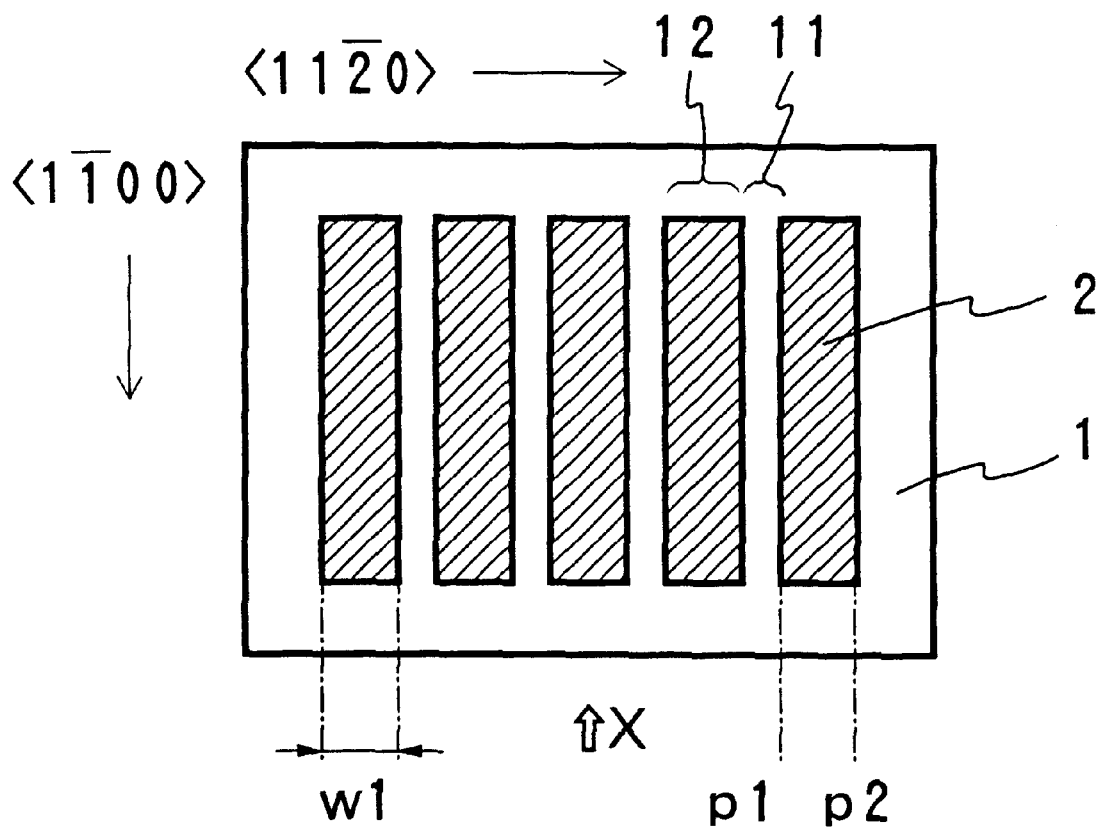
FIGS. 5(a), (b) show one embodiment of the substrate for growth to be used in the present invention.
Figure 5:
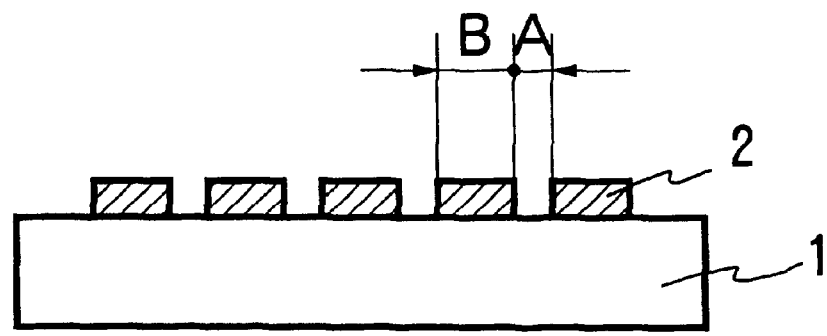

In the embodiment shown in FIG. 5, a mask layer 2 is formed on the surface of a base substrate 1 to divide a masked region 12 from a non-masked region 11. The masked region 12 and non-masked region 11 are both linear strips which are alternately formed in a periodic repeat pattern. The longitudinal direction of the linear strips of the masked region and non-masked region extends in the <1–100> orientation.

In the present invention, the preferable ranges are 1 $\mu$m$\leq$B$\leq$20 mm and 1 $\mu$m$\leq$A+B$\leq$25 mm, wherein the width of the masked region (namely, strip width in <11–20> orientation) is B and the width of the non-masked region is A (strip width in <11–20> orientation, as in B).

The repeat pattern of the masked region and non-masked region may give stripes as shown in FIG. 5 or each strip may extend forming a certain angle with the <1–100> orientation. In either way, the masked region and non-masked region form a regular repeat pattern in the <11–20> orientation as well.

The repeat pattern of the masked region and non-masked region may form a zigzag line. Besides, a repeat pattern of strips forming an optional curves, such as sign curve, a repeat pattern concentrically forming an annulus ring or hexagon masked region, a coiled repeat pattern and the like may be employed. Alternatively, a repeat pattern in which the ratio of A to B varies according to a certain relational formula may be used.

The width B of the masked region corresponds to the width of the low dislocation density GaN group crystal to be grown thereon. A width suitable for use may be determined within said width, wherein it may be used as it is or divided before use. When B exceeds 20 mm, the GaN group crystal will require a long time to cover the masked region. Nevertheless, when B is less than 2 $\mu$m, a mask layer cannot be formed easily, and the ratio of B to A+B becomes smaller to result in less reduction of dislocation density of the GaN group crystal obtained.

When the dislocation line linearly advances upward from the non-masked region, the non-masked region is preferably as small as possible, so that the limited area on the base substrate can be used most effectively and the largest possible area of the non-dislocation part is obtained at high speed. It is preferable that the proportional relation of A and B is always A$\leq$B. It is more preferable to set the proportion of B to A+B to 50%–99.998%, particularly 50%–99.98%. When the proportion of B to A+B exceeds 99.998%, A becomes too small to prevent easy formation of the non-masked region, and B becomes greater to require a large amount of time for the GaN group crystal to cover the masked region.

The present inventors have further found that, when openings (non-masked region) are disposed on the mask layer, an orthogonal matrix formed by the openings in the <1–100> orientation and <11–20> orientation as shown in FIG. 2 is associated with the following problem as shown in FIG. 8.

To be specific, as shown in FIG. 8(a), from the sides of the opening 4a, an off-facet plane 32 grows in the <11–20> orientation at high speed and a facet plane 31 grows moderately in the <1–100> orientation from the side extending in the <11–20> orientation. The off-facet plane is shown with a thick dotted line and the facet plane is shown with a thick line. Immediately after the crystal started growing from the opening in the transverse direction on the mask layer, the transverse growth planes can be considered to be only two planes in the directions orthogonally crossing with each other (e.g., FIG. 8(a), 31 and 32). As the growth proceeds, however, a facet plane 33 appears at the corner where the planes 31 and 32 cross with each other.

A continued crystal growth results in enclosure of the central portion (vicinity of center point m) which is located at the same distance from the four openings 4a, 4b, 4c and 4d. It occurs at a certain point of the growth by the facet planes 33a, 33b, 33c and 33d slow in growth, as shown in FIG. 8(b).

Once it is enclosed solely by the facet planes slow in growth, the enclosed area (space) requires a long time to be closed by a continued crystal growth. During that long time period, the crystal continues to grow at high speed in the thickness direction (C axis orientation). By the time the enclosed area is filled, the thickness of the crystal becomes unnecessarily great far exceeding the intended size. In addition, the central part (center point m) filled last consists of the crystals from the four directions which are joined at one point, having a low crystal quality with many defects.

Figure 7:
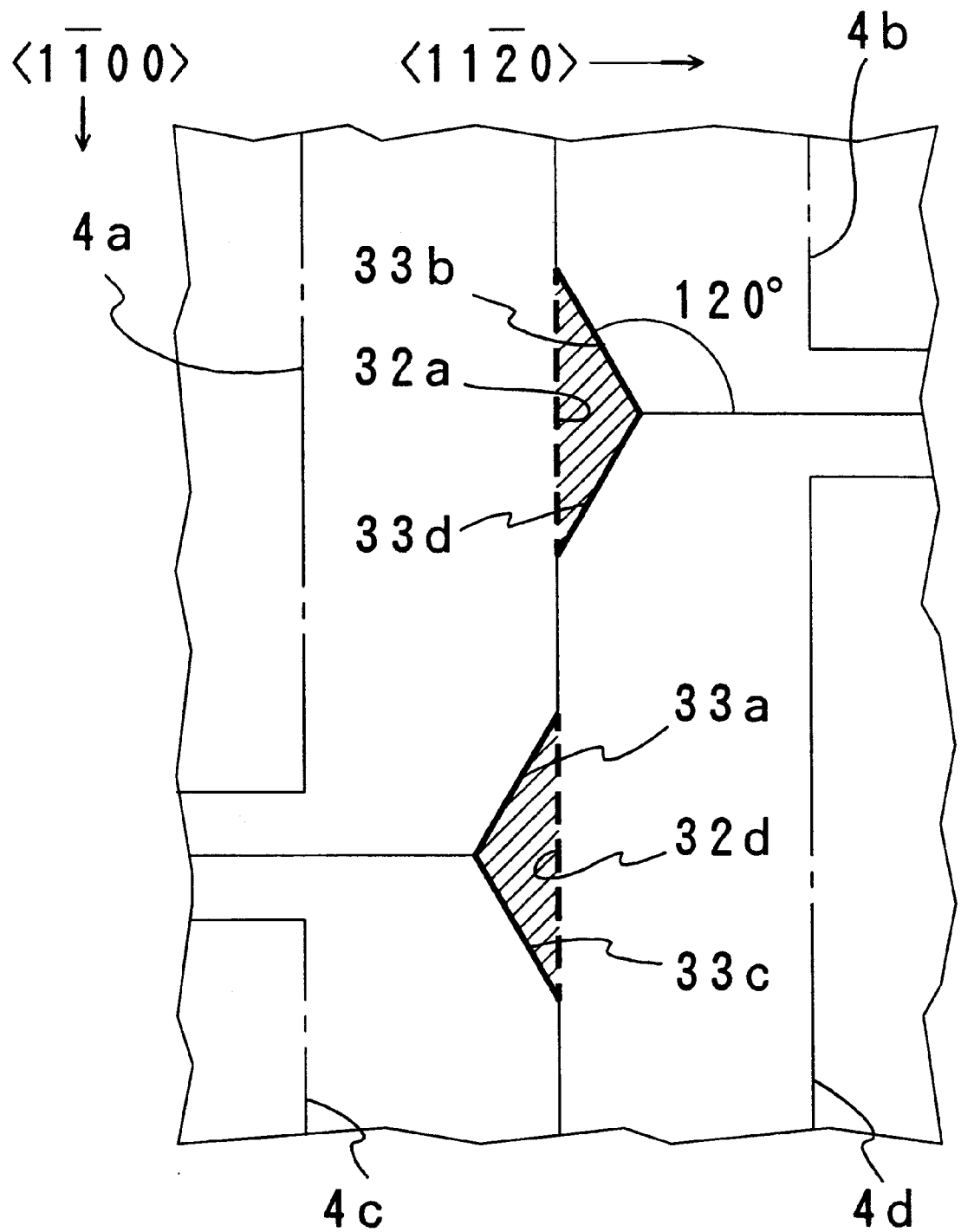
FIG. 7 shows the effect of the arrangement pattern of the openings in the present invention.

In the present invention, therefore, the pattern formed by the openings is set to be other than an orthogonal matrix formed by the openings in the <11–20> orientation and <1–100> orientation, but parallelogram (exclusive of square and rectangle) or square without the side in the <11–20> orientation. In this way, the enclosure only by the facet planes can be avoided and at least one of the above-mentioned problems can be solved. In particular, when, as shown in FIG. 7, the growth planes of the crystals gathered from respective openings enclose the central area, the position of the openings may be moved so that the central portion will be enclosed by two facet planes and one off-facet plane, whereby the remaining problems mentioned above can be entirely solved.

The problems solved in this way are the following.
a. High speed growth of off-facet plane enables filling of the enclosed area in a short time.
b. The enclosed area is closed at an earlier stage relative to the growth in the thickness direction, so that a crystal having a desired thickness can be obtained.
c. The portion closed last (center m) has a crystal structure collectively formed by the crystals gathered from three directions, so that the crystal quality can be improved as compared to the quality of the crystals from four directions. In addition, the enclosed area which was closed at an earlier stage continues to grow in the thickness direction, so that the crystal quality of said portion can be improved during the growth, and by the time the desired thickness is obtained, the surface layer of the crystal becomes far more improved in quality than it was when the area was closed.

Figure 6:
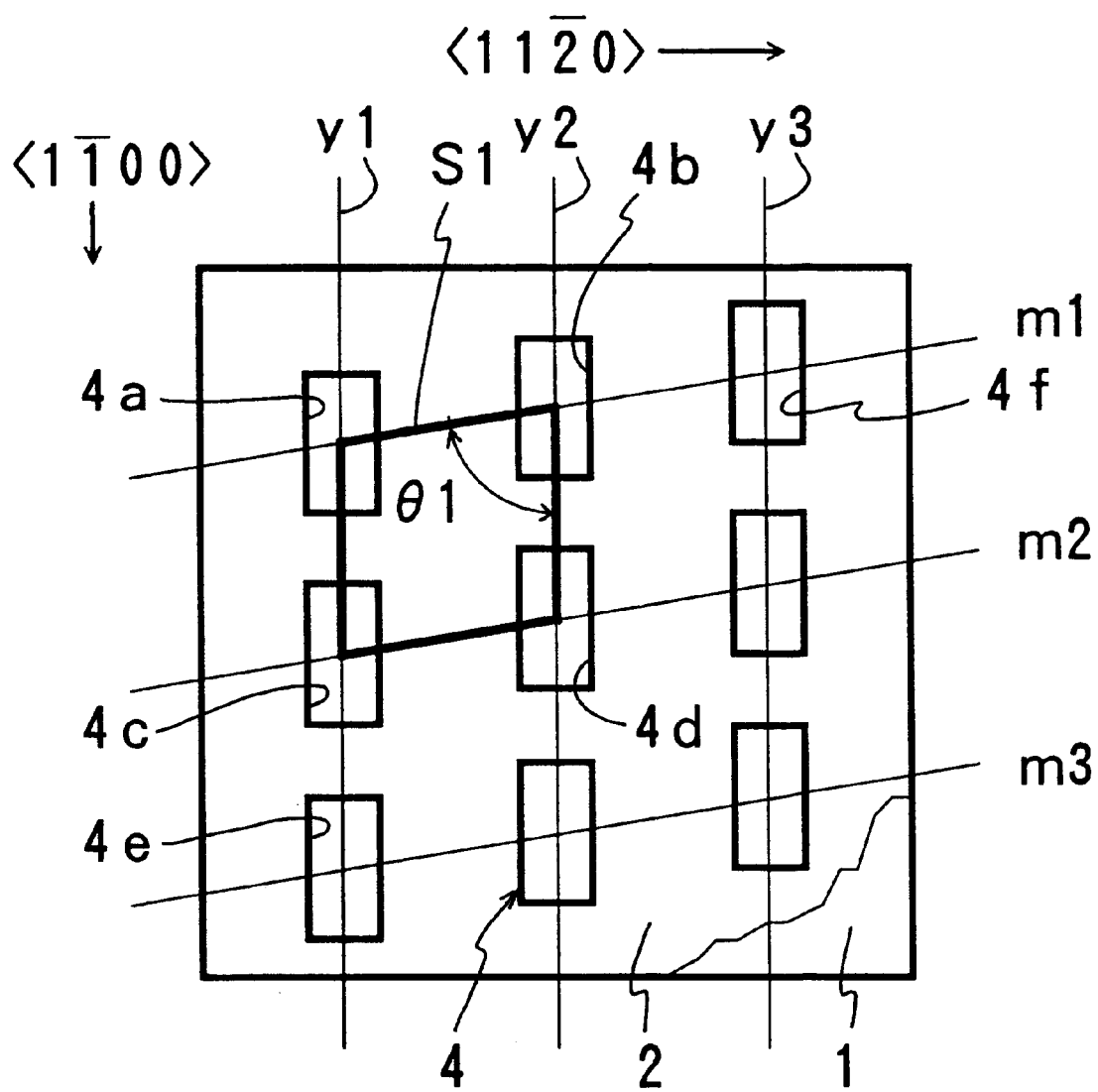
FIG. 6 shows one embodiment of the substrate for growth to be used in the present invention and the arrangement pattern of the openings on the mask layer.

In FIG. 6, on a base substrate 1 is formed a mask layer 2 (partially broken away in the Figure) and on the mask layer 2 are formed plural openings 4 in which the top surface of the base substrate 1 is exposed at the bottom. The pattern formed by the openings 4 at the top surface of the mask layer 2 is drawn by supposing a net having a quadrangle S1 (shown in a thick line) as the minimum constituent unit, on the surface of the mask layer. The openings 4 are formed on the intersection of the net lines. According to the present invention, this quadrangle S1 of the net may be a parallelogram or a square or rectangle without the side in the <11–20> orientation.

In the embodiment shown in FIG. 6, quadrangle S1 of the net is a parallelogram S1 formed by a part of the parallel two straight lines y1 and y2 extending in the <1–100> orientation, as parallel two sides. The pattern of the entire net supposed to be present on the surface of the mask layer in the embodiment of FIG. 6 is a net wherein the parallel straight lines y1 to y3 extending in the <1–100> orientation form an angle other than a right angle, namely, an angle θ1 (=one of interior angles of parallelogram) with the parallel lines m1 to m3. The openings near the outer periphery may be increased or decreased in number by, for example, omitting openings 4e and 4f, according to the outer shape of the substrate.

The net pattern may be, as shown in the embodiment of FIG. 6, completely congruent parallelogram defined only by the parallel lines in two directions, a pattern wherein mirror symmetrical parallelograms are alternately combined, a pattern wherein different parallelograms are combined and the like.

The shape of the parallelogram constituting the net pattern is preferably one wherein one of the two sides slides in the <1–100> orientation from the other side by half the length of said side. In the embodiment of FIG. 6, for example, it is a parallelogram wherein, of the openings 4a, 4b, 4c and 4d at the four vertexes of the parallelogram, the sets (4a, 4c and 4d) and (4a, 4d and 4b) come to the vertex of each isosceles triangle. The distance between the openings in the <1–100> orientation is about 1 μm–10 μm, whereas that in the <11–20> orientation along which the crystal grows at high speed is about 2 μm–50 μm. These sizes can be determined by referring to the crystal growth speed in the transverse direction.

Other embodiments of the net pattern include one wherein the minimum constituent unit quadrangle of the net is a parallelogram having two parallel sides extending in the <11–20> orientation, or a parallelogram including no straight line extending in the <1–100> orientation or <11–20> orientation, and the like.

As shown in FIG. 8(a), the plane 32 in the <1–100> orientation of the crystal which grows from the opening decreases due to the growth of the off-facet plane 33. In consideration of this, the shape of the opening is preferably one wherein the side in the <1–100> orientation has a sufficient length. To be specific, it is a quadrangle having a size falling within the range specified by 10 μm–10 mm in the <1–100> orientation and 1 μm–10 μm in the <11–20> orientation, and having a longer side in the <1–100> orientation.

In the present invention, low dislocation density and high quality crystal formed on the masked region or non-masked region is utilized to form a GaN group semiconductor element using the low dislocation density part. In so doing, it is essential that the width of the masked region and non-masked region be not less than the width of the active part of the element and not more than the width of the entire element. For example, when the part above the mask layer has a low dislocation density, the element is manufactured in such a manner that the masked region comes at least right beneath the active layer of the element. In this way, a high quality element can be ensured using the least possible part of the masked region.

When the mask layer forms a stripe pattern, GaN group semiconductor layer is formed to give a laminate including a number of elements, and the part above the mask layer has a low dislocation density, each element is preferably divided at the non-masked region. This obliterates useless breaking of high quality crystal parts when dividing the elements.

When an element is divided at a certain region, it is meant that a parting plane passes through said region and crosses the plane of each layer in a perpendicular relation.

While the element to be the production target is not particularly limited, the element may be, for example, a light emitting element, a light receiving element, power device and the like. As the light emitting element, exemplified are GaN group LED and GaN group semiconductor laser, and examples of power device include microwave FET, power MOSFET, HBT heterojunction bipolar transistor), MMIC (monolithic microwave integrated circuit) and the like.

Figure 10:
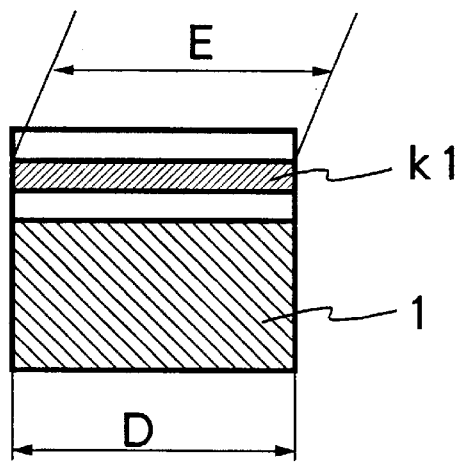
FIGS. 10(a)–(c) show examples of the width of the element and the width of the active part thereof.
Figure 10:
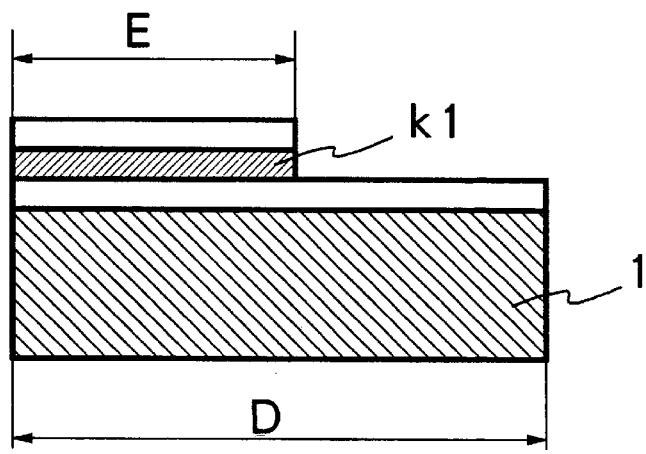
Figure 10:
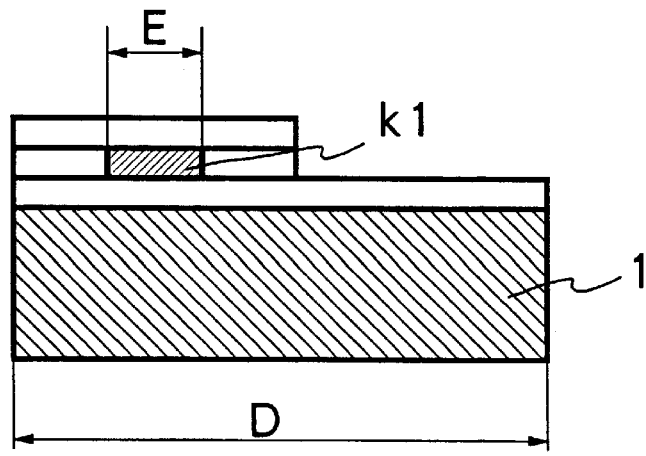

The width of the element as exemplified by a light emitting element is typically those shown in FIG. 10. FIG. 10(a) shows a GaN group LED having a GaN crystal as a substrate 1. The element as a whole is a simple rectangular parallelopiped wherein the width D of the element and the width E of the active part k1 are the same. FIG. 10(b) shows a GaN group LED having a sapphire crystal as a substrate, wherein the substrate is an insulating member requesting the electrode disposed at the upper side as shown in the Figure, and the width E of the active part k1 is smaller than the width D of the element. FIG. 10(c) shows a GaN group stripe laser having a sapphire crystal as a substrate, wherein the stripe structure necessitates the width E of the active part (stripe part) to be still smaller than the width D of the element, as compared to the LED of FIG. 10(b).

In a stripe laser, the part to be the width of the stripe part varies according to the embodiment of the laser element. The width of the stripe part corresponds to the width of the member when the stripe member is embedded; the width of a laminate in an embodiment where the width of the laminate between two planes of resonators is narrowed to make the shape of the laminate itself a stripe; and the width of an electrode where the electrode is a stripe and the part of the active layer, which comes beneath the electrode, becomes a stripe part. The embodiment shown in FIG. 10(c) has a width E of the stripe part k1 which is smaller than the width of the entire active layer.

The width of the element in FIG. 10 and the depth size of the element in the direction perpendicular to the paper surface vary depending on the kind of element, inclusive of one having a large area (e.g., LED array). Typically, the size of a light emitting element such as a laser is about width 200 µm–500 µm and depth 200 µm–1000 µm per one element.

Figure 11:
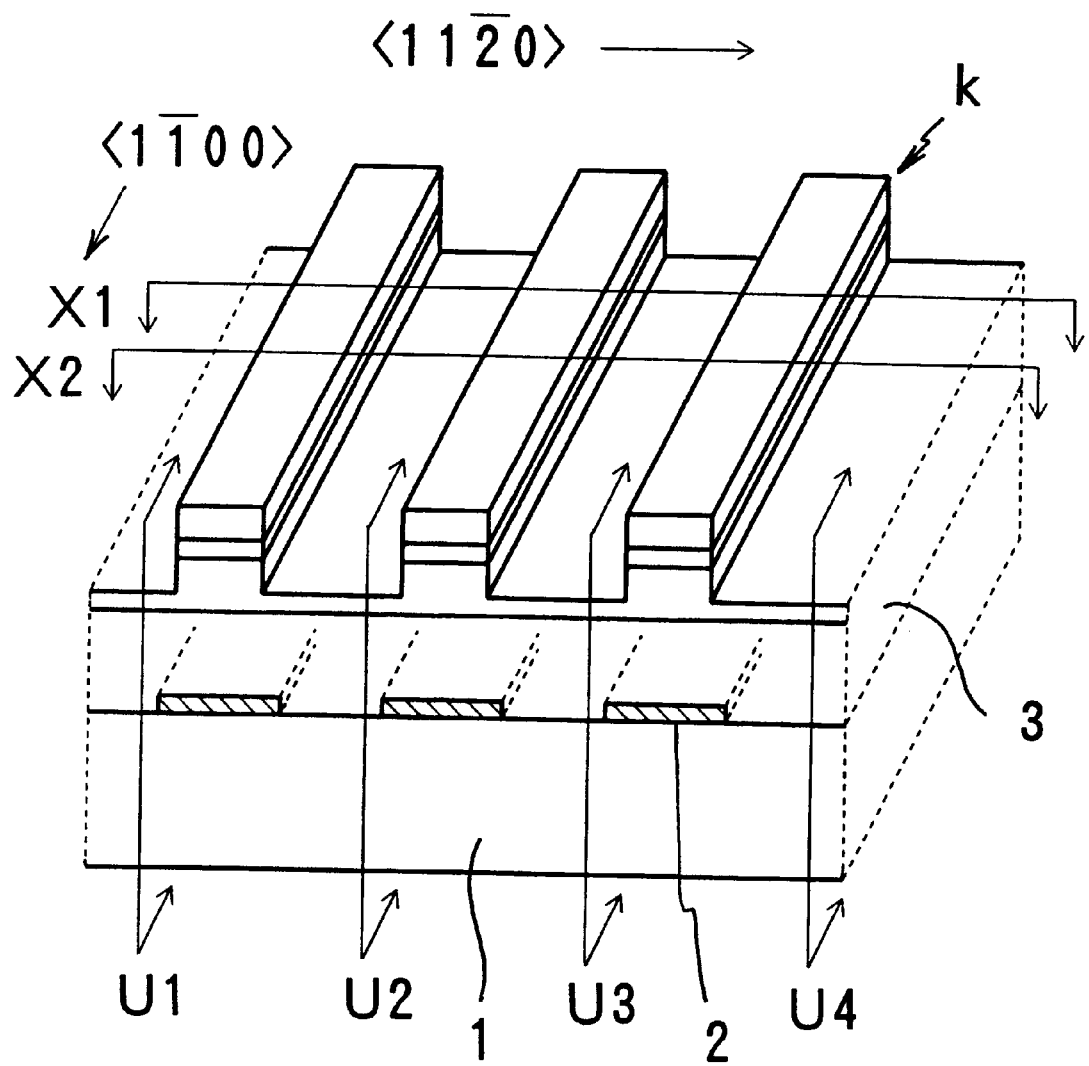
FIG. 11 is a perspective view showing the GaN group stripe lasers during production using the substrate for growth of the present invention, wherein the dotted lines on the both ends of the drawing are break lines and electrodes are omitted.

When the part above the masked region has a low dislocation density, as shown in FIG. 5, the width w1 between the two parallel straight lines p1 and p2 extending in the <1–100> orientation should be equal to the width of the production target element, particularly at least the width capable of being set beneath the active part. This enables efficient use of a high quality crystal above the masked region for an element, as shown in FIG. 9(b) and FIG. 11.

When the part above the masked region has a low dislocation density, it is preferable that a mask layer have two parallel straight lines extending in the <1–100> orientation which define the outer shape. The width between the two straight lines need only be that allowable to come beneath the active part, which may be selected from the range of from the width of the active part of the element to the width of the entire element. In the case of a stripe laser, for example, since it has a width selected from the range of from the width of the stripe (2 µm) to the width of the entire element (1000 µm), the width of the masked region should be also 2 µm–1000 µm. In the case of an LED array having a greater area, at least the width of the masked region is set to fall within the range of from the width of the active part to the width of the entire element.

When the masked region forms a stripe as shown in FIG. 5 and elements are formed above the masked region strips, a number of elements may be formed sequentially and integrally in the longitudinal direction above one masked region strip, and divided at a final stage. The width of the non-masked region then may be any as long as the division is effected. In the element shown in FIG. 10(c), when the width of the masked region and that of the active part are the same, the width of the masked region becomes minimum and that of the non-masked region at both sides thereof becomes maximum.

When the part above the masked region has a low dislocation density, the non-masked region becomes the starting point of the GaN group crystal layer growth as well as the cutting region for division. For example, when division utilizes braking, the width need only be that necessary as the starting point of the crystal growth rather than the width necessary for division, since the division scarcely requires a loss width. When the division involves the use of a diamond rotation blade, the loss should be considered to be about 20 µm–50 µm.

From the above-mentioned aspects, the width of the non-masked region is selected from the range of from about 0.5 µm–5 mm, particularly from about 1 µm–1 mm, when a low dislocation density part is to be formed above the masked region.

The method for manufacturing the element of the present invention as shown in FIG. 9(a), wherein the part above the masked region of the GaN group crystal layer has a low dislocation density, comprises growing a semiconductor layers k in such a manner that the active part comes at least above the masked region and forming a laminate containing a necessary number of elements. In the embodiment shown in this Figure, the element is a simple GaN group LED wherein the width of the mask, that of the element and that of the active part are the same. The active part which assumes the function of an element produces emission of light and includes a pn junction. As shown in FIG. 9(b), the laminate containing the necessary number of elements is divided to separate each element. The base substrate may or may not be removed.

When the element is a stripe laser, it is preferably formed and divided taking note of the fact that the stripe portion extends in the longitudinal direction and that the element contains a resonator.

For example, when the masked region forms a stripe as shown in FIG. 5 and a low dislocation density part is formed above the masked region, the longitudinal direction of the part to be a stripe part is the longitudinal direction of each masked region as shown in FIG. 11, and plural stripe lasers are efficiently formed in sequence above the masked region. With regard to the above-mentioned second point to be noted, the entire laminate is divided along the plane perpendicular to the longitudinal direction of the stripe part, before division into each stripe part (e.g., division along X1 and X2 in FIG. 11) to form a string of adjoining elements in the <11–20> orientation as shown in FIG. 11. The end surface appearing on the plane of division of every strip is treated to make a reflector, and a resonator is integrally finished. Then, each GaN group stripe laser is efficiently separated by cutting along the plane parallel to the longitudinal direction of the stripe part (e.g., in FIG. 11, division along U1 to U4).

Conventionally, the dislocation line present in the GaN group crystal layer 3 has been considered to advance linearly in the thickness direction along with the growth of the layer, as shown in FIG. 1. Nevertheless, the present inventors have clarified that the dislocation line generated in the non-masked region can be freely led to the part above the masked region or non-masked region by determining a mask layer pattern, crystal growth method and atmospheric gas during the crystal growth in combination. In other words, in the GaN single crystal layer 3 in FIG. 1, any part above the masked region and non-masked region can be made to have a low dislocation density.

In the present invention, as shown in FIG. 12(a) and FIG. 13(a), a mask layer 2 is formed on the base substrate 1 (wherein 12 is a masked region and 11 is a non-masked region), and GaN group crystal is grown from the non-masked region. In so doing, the ratio of the growth rate in the C axis orientation (thickness orientation) of said GaN group crystal and that in the orientation perpendicular to the C axis (transverse direction) is controlled to vary the crystal growth to the following (i) or (ii).

(i) When the growth rate in the C axis orientation is greater, the morphology of the surface upon crystal growth becomes that of a pyramid as shown in FIG. 12(b). In this way, the direction of the advancement of the dislocation line L can be bent toward the masked region side as shown in this Figure. Further crystal growth leads to joining of the crystals from the adjacent masked regions as shown in FIG. 12(c), making the pyramidal top surface of the crystal layer flat. Along therewith, the dislocation line goes upward along the joining surface of the crystals.

(ii) When the growth rate in the direction perpendicular to the C axis becomes greater, the morphology of the surface upon crystal growth becomes that of trapezoid having a flat top surface, as shown in FIG. 13(b). In this way, the dislocation line L can be linearly led upward as shown in this Figure. Further crystal growth leads to joining of the crystals from the adjacent masked regions as shown in FIG. 13(c), while retaining the flat top surface only to increase the thickness of the crystal layer. In this case, the dislocation line continues to go upward.

The controlling factors of the ratio of the above-mentioned growth rate in the C axis orientation and that in the orientation perpendicular to the C axis are the pattern formed by the mask layer, crystal growth method and atmospheric gas during the crystal growth, and achievement of the above-mentioned crystal growth modes (i) and (ii) hinges on certain combination of these factors.

For controlling the advancement direction of the dislocation line, the pattern of the mask layer is based on the direction of the boundary line between the masked region and non-masked region. As explained earlier, when the boundary line between the masked region and non-masked region is a straight line extending in the <1–100> orientation, the off-facet plane grows in the transverse direction at a higher rate. As a result, the surface of the mask layer is covered while the GaN group crystal layer is still thin, as compared to the case of <11–20> orientation to be mentioned next.

Conversely, when the boundary line between the masked region and non-masked region is a straight line extending in the <11–20> orientation, the {1–100} plane, which is a facet plane, extends beyond this boundary line into the transverse direction, making the growth rate in the transverse direction slower. Inasmuch as the growth rate in the C axis direction is higher than that in the transverse direction, slant facet such as {1–101} plane tends to be formed. It necessitates making the plane flat after the pyramid plane is formed first. Consequently, the flat plane requires a certain thickness.

One example of the pattern showing the most noticeable effect of the above-mentioned mask pattern is the stripe one shown in FIG. 5. The longitudinal direction of this strip is the direction of the boundary line between the above-mentioned masked region and non-masked region.

Examples of the crystal growth method include HVPE, MOCVD and the like. When a thick film is to be manufactured, the HVPE method affording a higher growth rate is preferred.

The atmospheric gas is exemplified by $H_2$, $N_2$, Ar, He and the like, and $H_2$ and $N_2$ are preferably used for controlling the dislocation line.

When the crystal growth is carried out in an $H_2$ rich atmospheric gas, the growth rate in the C axis orientation becomes higher. In particular, when the direction of the boundary line between the masked region and non-masked region is a straight line in the <11–20> orientation, namely, slow in the transverse direction, the ratio of the rate in the C axis orientation becomes significantly greater, thereby making the crystal above the non-masked region have a low dislocation density.

In contrast, when the crystal growth is carried out in an $N_2$ rich atmospheric gas, the growth rate in the C axis orientation becomes lower than that when an H rich atmosphere is employed, as a result of which the growth rate in the transverse direction becomes relatively greater. When the growth rate in the transverse direction is accelerated by the combination with the mask pattern, the crystal above the masked region comes to have a low dislocation density, as shown in FIG. 13.

The crystal growth by MOCVD is mainly carried out under an $H_2$ rich atmosphere. For example, when a combination of carrier gas hydrogen (10 L)+hydrogen gas (100 cc) for organic metal bubbling as a III group gas and carrier gas hydrogen (5 L)+ammonia (5 L) as a V group gas are used, a hydrogen concentration is 75%, which is one example of $H_2$ rich atmosphere having 0% nitrogen concentration.

On the other hand, in $N_2$ rich atmosphere in the case of the above-mentioned MOCVD crystal growth, the nitrogen concentration when the III group carrier gas is changed to nitrogen is about 50%. When the V group carrier gas alone is changed to nitrogen, the nitrogen concentration is about 25%. Thus, a gas having a nitrogen concentration of not less than about 25% is designated to be $N_2$ rich.

Figure 14:
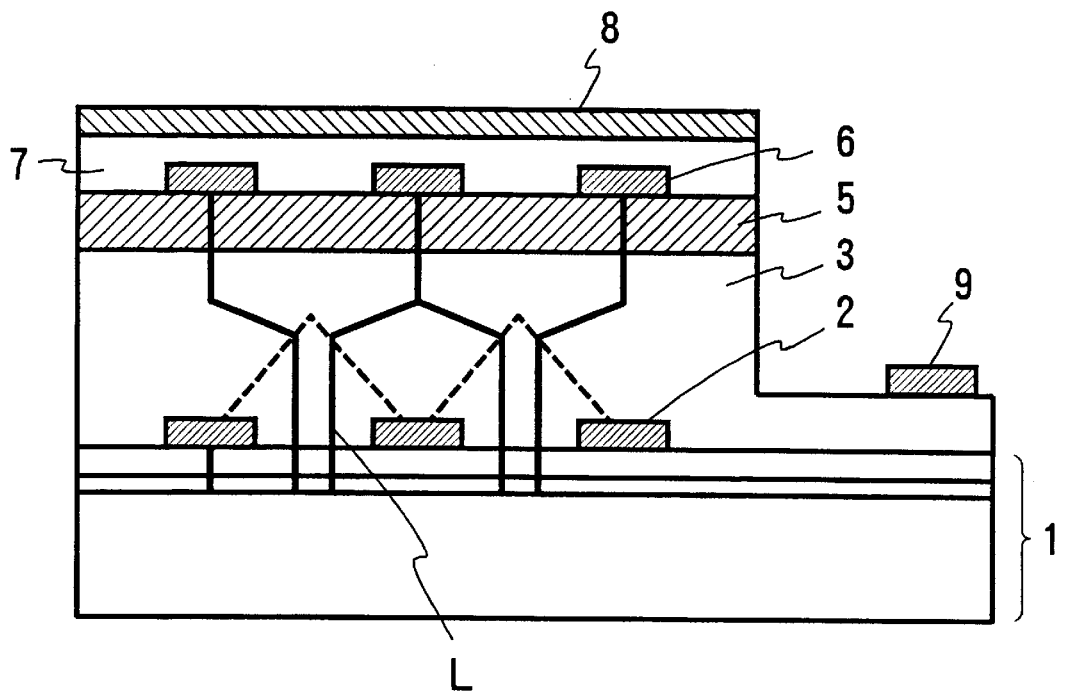
FIG. 14 shows one embodiment of the GaN group light emitting element obtained by the method of FIG. 12.
Figure 15:
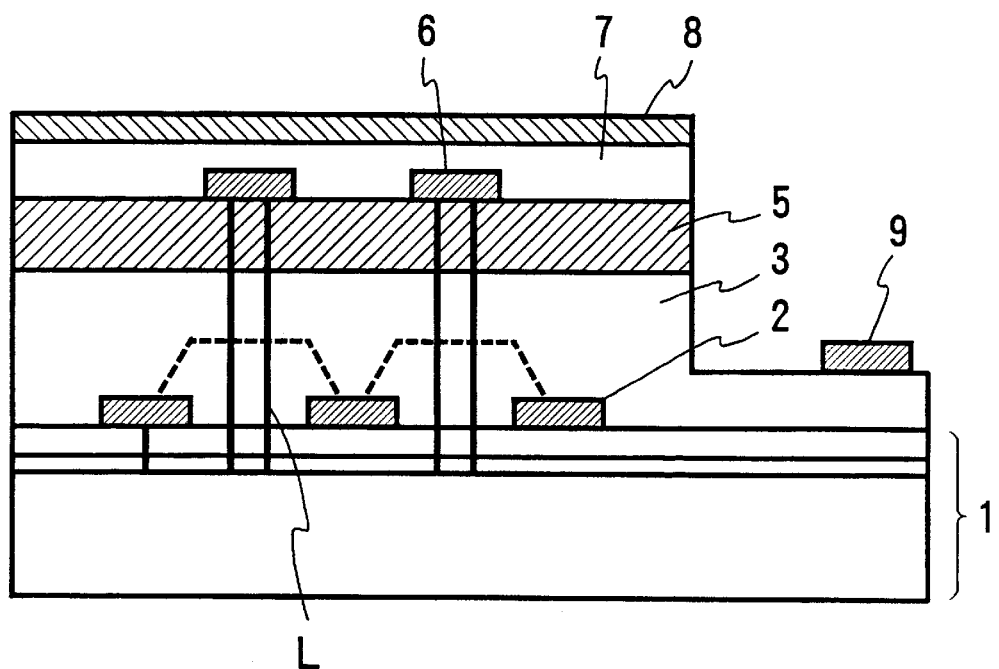
FIG. 15 shows one embodiment of the GaN group light emitting element obtained by the method of FIG. 13.

The part of the GaN group crystal having a low dislocation density which is obtained by intentionally avoiding the passage of the dislocation line is positioned at the center of a light emitting part of a light emitting layer, so that a preferable light emitting element as shown in FIGS. 14 and 15 can be obtained.

The element shown in FIG. 14 is one embodiment of the GaN group LED of the present invention, wherein, in the active layer 5 of the element, the part above the non-masked region has a low dislocation density. This part having a low dislocation density is the center of the light emission due to a current stricture structure. In contrast, in the active layer 5 of the element of the GaN group LED shown in FIG. 15, the part above the masked region has a low dislocation density and is the center of the light emission.

When the preferable conditions to grow the GaN group crystal faster in the transverse direction are not known, the GaN group crystal has greatly grown in the thickness direction as well when the GaN group crystal has completely covered the mask layer, which inevitably increases the thickness T from the top surface of the mask layer to the top surface of the GaN group crystal layer. When the width W of the mask layer is reduced, however, the GaN group crystal quickly covers the mask layer completely, thereby making the thickness T smaller. In consequence, the ratio of the thickness T from the top surface of the mask layer of the GaN group crystal layer to the width W of the mask layer, T/W, cannot become smaller than a certain level. This in turn has resulted in the problem that a GaN group crystal layer formed on a sufficiently wide masked region inevitably becomes thick and is associated with cracks and warping.

The smallest ratio T/W heretofore reported is 1.75 wherein the width W of the mask layer is that in the <11–20> orientation, and T=7 $\mu$m when W=4 $\mu$m.

Figure 16:
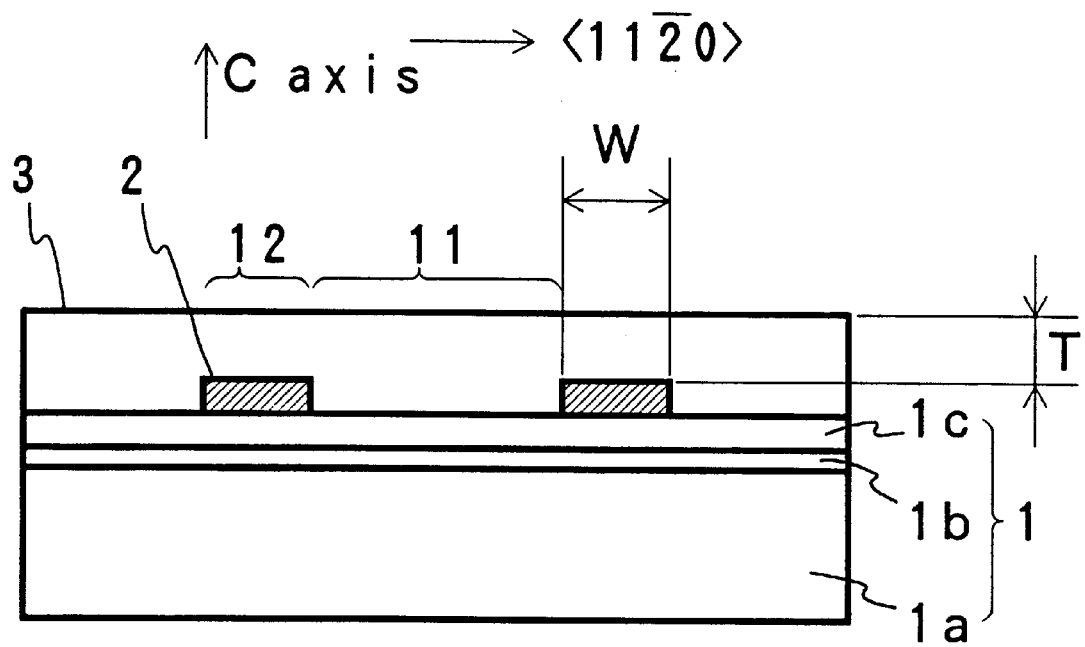
FIG. 16 shows one embodiment of the structure of the GaN group crystal base member obtained by the manufacturing method of the present invention.

The present invention suggests, as stated with respect to the method for controlling the direction of the above-mentioned dislocation line, that the pattern of the mask layer be such having the boundary line between the masked region and non-masked region extending in the <1–100> orientation, the GaN group crystal be grown by MOCVD (Metal Organic Chemical Vapor Deposition) and the atmospheric gas in which the GaN group crystal is grown by the MOCVD be an $N_2$ rich gas. When these three requirements are fulfilled, the ratio of the thickness T of the GaN group crystal layer 3 covering the mask layer 2 formed on the base substrate 1 to the width W of the mask layer 2 in the <11–20> orientation, T/W, becomes not more than 1.75, whereby a thin GaN group crystal layer conventionally unattainable as shown in FIG. 16 can be obtained.

The present invention is described in more detail in the following by way of illustrative Examples and Comparative Examples, which are not to be construed as limiting the present invention.

EXAMPLE 1

A 20 nm thick AlN buffer layer was grown at a low temperature using a MOVPE device on a sapphire substrate (C face) having a diameter of 2 inches and a thickness of 330 $\mu$m, and a 1.5 $\mu$m GaN thin layer was grown thereon to give a base substrate. An $SiO_2$ thin film having a thickness of 500 nm was formed as a masking material on the surface of this substrate by a sputtering method, and a mask layer was formed by leaving the mask material in a lattice pattern at a line width of 100 $\mu$m and 200 $\mu$m pitch by etching. That is, 100 $\mu$m square exposed parts were arrayed at 200 $\mu$m intervals. This new substrate was set in an HVPE device to grow 300 $\mu$m thick n-type GaN layer. The mask layer was completely embedded, wherein the surface flatness was fine, and a 2 inch diameter n-type GaN group crystal base member was obtained.

The GaN on the mask layer was evaluated by TEM. As a result, the dislocation density was not more than $1 \times 10^2$ $cm^{-2}$.

EXAMPLE 2

Using the same manufacturing method as in Example 1, a 50 nm thick AlN buffer layer and a 1.5 $\mu$m GaN thin layer were grown on a sapphire substrate (C face) having a diameter of 2 inches and a thickness of 330 $\mu$m to give a base substrate. The mask pattern was a stripe wherein 500 nm thick, 200 $\mu$m wide linear $SiO_2$ mask layers and 200 $\mu$m wide exposed parts were alternately disposed. The longitudinal direction of the stripe was the <1–100> orientation. This was set in an HVPE device to grow a 220 $\mu$m thick n-type GaN layer. The mask layer was completely embedded without occurrence of cracks, whereby a 2 inch diameter n-type GaN group crystal base member having fine surface flatness was obtained.

EXAMPLE 3

In the same manner as in Example 1, a mask layer having a lattice pattern and an n-type GaN layer were grown on a base substrate. A second mask layer having the same lattice pattern as in Example 1 was grown on this n-type GaN layer. This second mask layer covered right above the non-masked region. This was set in an HVPE device to grow a 300 $\mu$m thick second n-type GaN layer.

The second n-type GaN layer thus obtained was evaluated by TEM. As a result, the dislocation density was not more than $1 \times 10^2$ $cm^{-2}$.

EXAMPLE 4

A mask layer made from an $SiO_2$ thin film was formed by a sputtering method so that a linear strip pattern as shown in FIG. 5 was drawn on the surface of the base substrate similar to that used in Example 1 to give a substrate for growth. The mask layer was formed to have strips extending in the <1–100> orientation. The proportion of B to A+B was 90.9% where the thickness was 0.5 $\mu$m, strip width (=width B of masked region) was 100 $\mu$m and intervals between strips (=width A of non-masked region) was 10 $\mu$m.

A GaN crystal was grown on this substrate for growth by an HVPE device at a 50 $\mu$m/hr growth rate for 4 hr to give a 200 $\mu$m thick GaN crystal layer. The dislocation density of the GaN crystal grown on the masked region was evaluated by TEM. As a result, the dislocation density was not more than $1 \times 10^4$ $cm^{-2}$. The sapphire substrate was removed by abrasion to give a flat GaN crystal substrate.

EXAMPLE 5

A 25 $\mu$m thick GaN crystal was grown under the conditions wherein the width B of the masked region was 1 $\mu$m, the width A of the non-masked region was 1 $\mu$m and the proportion of B to A+B was 50%.

As a result of the processing in this Example, it has been found that setting the width B of the masked region to less than 1 $\mu$m is technically difficult. It has also been found that reduction of the dislocation density becomes small unless B/(A+B) is large, which in turn causes noticeable problems of significantly reduced crack prevention effect, thereby reducing the advantageous effects of the present invention.

EXAMPLE 6

A 11 mm thick GaN crystal was grown in the same manner as in Example 1 under the conditions wherein the width B of the masked region was 20 mm, the width A of the non-masked region was 0.5 $\mu$m and the proportion of B to A+B was 99.998%.

The sapphire substrate was removed by abrasion to give a GaN single crystal substrate which was a thick, bulky and flat crystal having a wide area. The irregularities on the surface were somewhat greater than those found in Examples 1 to 3.

It has been clarified from this Example that the width of the masked region should be 20 mm at the greatest. When the width of the masked region is greater than this, the time necessary for the step becomes longer and the surface morphology tends to be degraded. As a result of the processing wherein the width A of the non-masked region was 0.5 $\mu$m, it was found that the width A of less than 0.5 $\mu$m was difficult to achieve. Thus, the proportion of B to A+B is preferably about 99.998% at the greatest.

EXAMPLE 7

A 11 mm thick GaN crystal was grown in the same manner as in Example 1 under the conditions wherein the width B of the masked region was 20 mm, the width A of the non-masked region was 5 mm and the proportion of B to A+B was 80%. As a result, the GaN crystal layer contained numerous cracks extending from the non-masked region to the masked region. Thus, a greater width of the non-masked region was not desirable due to the occurrence of cracks, and the upper limit of A was 5 mm.

EXAMPLE 8

An $SiO_2$ mask layer was formed on the surface of the base substrate similar to that used in Example 1. Then, openings were formed by etching to give a substrate for growth of the type shown in FIG. 6. The shape of the openings was congruent, which was a rectangle having the size of <11–20> orientation 3 $\mu$m × <1–100> orientation 100 $\mu$m.

The pattern of the disposed openings was such that the width of the masked region sandwiched between the adjacent openings was 5 $\mu$m in the <11–20> orientation and 2 $\mu$m in the <1–100> orientation, and the shape of parallelogram of the net pattern was such that one of the two sides in the <1–100> orientation slid by a half of the length of the side in the <1–100> orientation.

The above-mentioned substrate for growth was set on an HVPE device, and a 200 μm thick GaN group crystal layer was formed from the non-masked region as the starting point. The GaN group crystal grew on the mask layer in the transverse direction as well to completely cover the mask layer.

The flatness of the GaN group crystal layer surface was fine. The part formed by the crystals that grew in the transverse direction and joined from each opening further grew in the thickness direction after the joining. The surface layer and the vicinity thereof had fine crystal quality.

EXAMPLE 9

In this Example, the objective element to be formed was a stripe laser. As shown in FIG. 5, the mask layer was a parallel stripe extending in the <1–100> orientation of GaN crystal. The substrate for growth was prepared in the same manner as in Example 1, wherein the pattern of the mask layer was width 150 μm and the central pitch 300 μm.
Stripe Laser Structure A 100 μm GaN crystal layer was formed on the substrate for growth to give a substrate, on which were sequentially grown in its entirety n-GaN layer/n-AlGaN layer/n-GaN layer/InGaN multi-quantum well layers/p-AlGaN layer/p-GaN layer/p-AlGaN layer/p-GaN layer. The laminate was etched by RIE (Reactive Ion Etching) leaving 8 μm width strips to give a stripe laminate as shown in FIG. 11 by k. The stripe was aligned with the about center of the mask layer, so that the stripe could be in the <1–100> orientation. Abrasion removed the sapphire substrate (C face) to make the entire thickness 80 μm.
Division Into Each Element Cleavage along the plane orthogonally crossing the longitudinal direction of the stripe as the parting plane, namely, cleavage along X1 and X2 in FIG. 11 and at 500 μm pitch in parallel relation thereto (cleavage at M plane), gave a number of elements in sequential adjacency in the <11–20> orientation. A necessary coating was applied to the reflector surface thereof at once to finish the resonator. Then, the elements were separated along U1 to U4 in FIG. 11 to give respective laser chips.

This Example confirmed efficient forming of elements by aligning the masked region with the stripe part. In addition, by determining the stripe direction and by the above-mentioned steps of division, efficient production of stripe lasers was attained.

EXAMPLE 10

Figure 12:
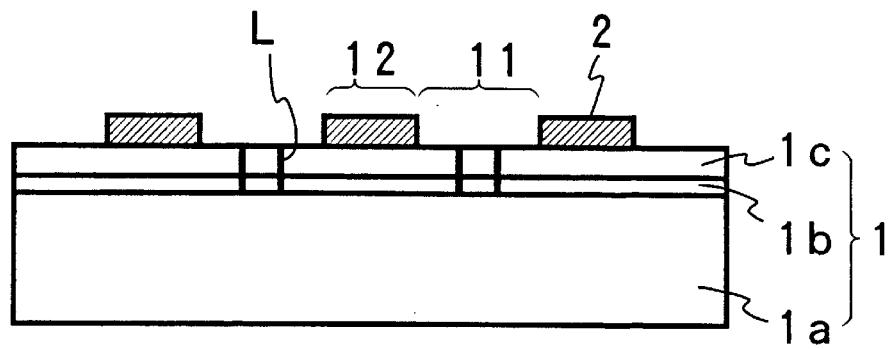
FIGS. 12(a)–(c) show a method for controlling the dislocation line according to the present invention and one embodiment of the manufacturing method of the GaN group crystal base member of the present invention.
Figure 12:
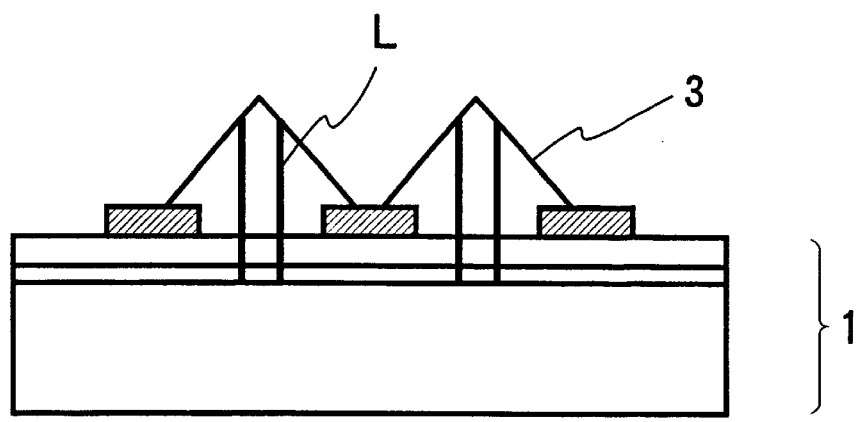
Figure 12:
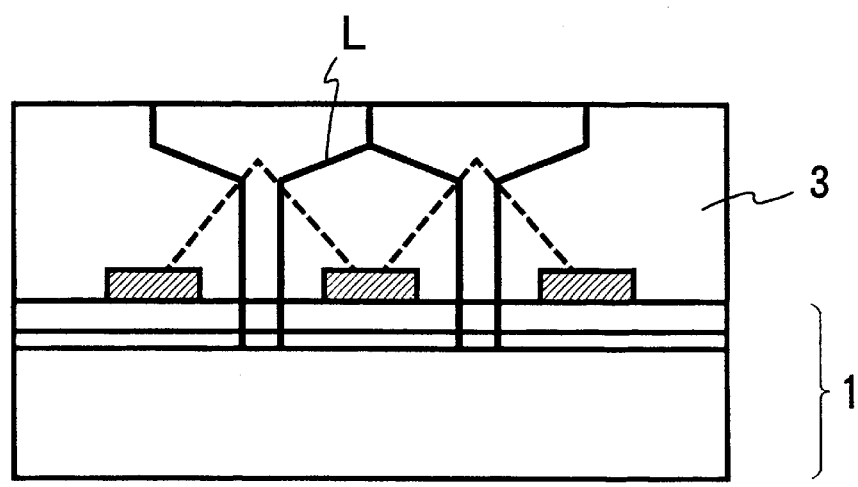

As shown in FIG. 12, the dislocation line was bent to the part above the masked region to make the part above the non-masked region a low dislocation density part.
Base Substrate As the most basic crystal substrate, used was a sapphire substrate (C face). On the surface thereof, an AlN low temperature buffer layer and GaN layer were grown to the thickness of 2 μm to give a base substrate.
Mask Layer The substrate was taken out from the growth apparatus and an SiO₂ mask layer was formed by sputtering. The pattern of the mask layer was a stripe wherein the longitudinal direction of the strip was the <11–20> orientation of the GaN group crystal to be grown.
Growth of GaN Group Crystal; Completion of Base Member Then, this specimen was placed in an MOCVD device and heated to 1000° C. under a hydrogen atmosphere containing ammonia. TMG and ammonia were flown for 30 min to grow GaN crystal. The GaN crystal first grew in a pyramid shape as shown in FIG. 12(b), and the dislocation line was bent toward the masked region side. The crystal was further grown until it became flat at 10 μm.
Light Emitting Element As shown in FIG. 14, a current blocking layer 6 was formed in such a manner that the low dislocation density part came to the light emitting center of the light emitting layer 5 to form a light emitting element. As a result, one having a high light emission efficiency was prepared. In FIG. 14, 7 is an upper cladding layer and 8 and 9 are electrodes.

EXAMPLE 11

In the same manner as in Example 1 except that the mask layer stripe had a longitudinal direction which was the <1–100> orientation of the GaN group crystal to be grown and the atmospheric gas was nitrogen rich, a GaN group crystal layer was formed. The thickness until it became flat was 2 μm.

As shown in FIG. 15, thereafter, a current blocking layer 6 was formed in such a manner that the low dislocation density part came to the light emitting center of the light emitting layer 5 to form a light emitting element. As a result, a light emitting element having a high light emission efficiency was obtained. As in FIG. 14, 7 is an upper cladding layer and 8 and 9 are electrodes.

EXAMPLE 12

In this Example, a thin GaN crystal was formed.
Base Substrate

As the most basic crystal substrate, used was a sapphire substrate (C face). On the surface thereof, an AlN low temperature buffer layer and GaN layer were grown to the thickness of 2 μm to give a base substrate.
Mask Layer An SiO₂ mask layer was formed by sputtering. The pattern of the mask layer was a stripe wherein the longitudinal direction of the strip was the <1–100> orientation of the GaN group crystal to be grown. The width of the strip of the non-masked region was 4 μm and the width W of the strip of the masked region was 4 μm.
Growth of GaN Crystal; Completion of Base Member Then, this specimen was placed in an MOCVD device and heated to 1000° C. under a nitrogen rich atmospheric gas (III group carrier gas nitrogen (10 L), gas (100 cc) for organic metal bubbling, V group carrier gas hydrogen (5 L), ammonia (5 L)). TMG and ammonia were fed to grow GaN crystal. The GaN crystal at the point the surface of the mask layer was completely embedded had a thickness T of 2 μm, as shown in FIG. 16. Thus, T/W was 0.5.

Comparative Example 1

In the same manner as in Example 1 except that the atmospheric gas was changed from nitrogen rich to hydrogen rich, a GaN crystal was grown. The GaN crystal at the point the surface of the mask layer was completely embedded had a thickness T of 7 μm. Thus, T/W was 1.75.

Comparative Example 2

In the same manner as in Example 1 except that the atmospheric gas was changed from nitrogen rich to hydrogen rich and the longitudinal direction of the stripe of the mask layer was the <11–20> orientation, a GaN crystal was grown. The GaN crystal at the point the surface of the mask layer was completely embedded had a thickness T of 12 μm. Thus, T/W was 3.

What is claimed is:

1. A GaN group crystal base member comprising a base substrate, a mask layer for controlling an extension of dislocation line partially covering the surface of said base substrate to give a masked region, and a GaN group crystal layer grown thereon to cover said mask layer, which is partially in direct contact with a non-masked region of the base substrate, wherein the base substrate has at least a surface layer represented by the formula:

$$In_xGa_yAl_zN$$

wherein $0 \leq X \leq 1$, $0 \leq Y \leq 1$, $0 \leq Z \leq 1$, $X+Y+Z=1$.

2. A GaN group crystal base member comprising a base substrate, a mask layer for controlling an extension of dislocation line partially covering the surface of said base substrate to give a masked region, and a GaN group crystal layer grown thereon to cover said mask layer, which is partially in direct contact with a non-masked region of the base substrate, wherein the GaN group crystal layer is a first GaN group crystal layer, which further comprises a second mask layer partially covering the surface of said first GaN group crystal layer and a second GaN group crystal layer grown thereon to cover the second mask layer, which is partially in direct contact with a non-masked region of the first GaN group crystal layer.

3. A GaN group crystal base member to be used as a crystal substrate of a GaN semiconductor element, comprising a base substrate, a mask layer for controlling an extension of dislocation line partially covering the surface of said base substrate to give a masked region, and a GaN group crystal layer grown thereon to cover said mask layer, which is partially in direct contact with a non-masked region of the base substrate, wherein the base substrate permits growth of a GaN group crystal in the C axis orientation as the thickness direction, and the mask layer is made from a material substantially free from GaN group crystal growth, and wherein the GaN crystal layer has grown to cover the mask layer from a non-masked region as the growth starting point, and the mask layer forms a pattern wherein the width of the part having a low dislocation density within said crystal exceeds the width of an active part of said GaN group semiconductor element.

4. The GaN group crystal base member of claim 3, wherein a masked region and a non-masked region are alternately repeated periodically, said periodic repetition comprising at least a repetition in a <11–20> orientation of the GaN group crystal to be grown on said base substrate, a width B of said masked region in the <11–20> orientation and a width A of said non-masked region being defined by $1 \mu m \leq B \leq 20$ mm and $1 \mu m < A+B \leq 25$ mm.

5. The GaN group crystal base member of claim 3, wherein the mask layer has plural openings on the surface thereof, the base substrate being exposed at the bottom of the openings, an arrangement pattern of said openings on the surface of the mask layer being one wherein the openings are positioned at intersections of net lines forming a quadrangle as the smallest constituent unit, said quadrangle being a square without a side in the <11–20> orientation of the GaN group crystal to be grown on the base substrate, or parallelogram.

6. The GaN group crystal base member of claim 3, wherein the ratio of a thickness T of the GaN group crystal layer covering the mask layer from the mask layer surface to a width W of the mask layer in the <11–20> orientation is T/W<1.75.

7. The GaN group crystal base member of claim 3, wherein the GaN group semiconductor element is a GaN group light emitting diode.

8. A GaN group crystal base member to be used as a crystal substrate of a GaN semiconductor element, comprising a base substrate, a mask layer for controlling an extension of dislocation line partially covering the surface of said base substrate to give a masked region, and a GaN group crystal layer grown thereon to cover said mask layer, which is partially in direct contact with a non-masked region of the base substrate, wherein the base substrate permits growth of a GaN group crystal in the C axis orientation as the thickness direction, and the mask layer is made from a material substantially free from GaN group crystal growth, and wherein a masked region having, as outer shape lines, two parallel straight lines extending in the <1–100> orientation of the GaN group crystal to be grown on said base substrate, and the width between the two straight lines being not more than the width of said GaN group semiconductor element and not less than the width of an active part of said element.

9. The GaN group crystal base member of claim 8, wherein a masked region and a non-masked region are alternately repeated periodically, said periodic repetition comprising at least a repetition in a <11–20> orientation of the GaN group crystal to be grown on said base substrate, a width B of said masked region in the <11–20> orientation and a width A of said non-masked region being defined by $1 \mu m \leq B \leq 20$ mm and $1 \mu m < A+B \leq 25$ mm.

10. The GaN group crystal base member of claim 8, wherein the mask layer has plural openings on the surface thereof, the base substrate being exposed at the bottom of the openings, an arrangement pattern of said openings on the surface of the mask layer being one wherein the openings are positioned at intersections of net lines forming a quadrangle as the smallest constituent unit, said quadrangle being a square without a side in the <11–20> orientation of the GaN group crystal to be grown on the base substrate, or parallelogram.

11. The GaN group crystal base member of claim 8, wherein the ratio of a thickness T of the GaN group crystal layer covering the mask layer from the mask layer surface to a width W of the mask layer in the <11–20> orientation is T/W<1.75.

12. The GaN group crystal base member of claim 8, wherein the GaN group semiconductor element is a GaN group stripe laser, the width of said active part is the width of a stripe part in the stripe laser, and the direction of the extension of the two parallel lines is the longitudinal direction of the stripe part in the stripe laser.

* * * * *